United States Patent Office 3,549,367

Patented Dec. 22, 1970

3,549,367

PHOTOPOLYMERIZABLE COMPOSITIONS CONTAINING TRIARYLIMIDAZOLYL DIMERS AND p-AMINOPHENYL KETONES

Catherine Teh-lin Chang, New Brunswick, and Roxy Ni Fan, East Brunswick, N.J., assignors to E. I. du Pont de Nemours and Company, Wilmington, Del., a corporation of Delaware No Drawing. Filed May 24, 1968, Ser. No. 731,733

Int. Cl. G03c *1/68*

U.S. Cl. 96—35.1 14 Claims

ABSTRACT OF THE DISCLOSURE

Photopolymerizable compositions and layers containing an ethylenically unsaturated compound capable of free-radical addition polymerization and having improved photographic speed, spectral response, aging and storage stability are obtained by using as a photoinitiating system a triarylimidazolyl dimer consisting of two lophine radicals bound together by a single covalent bound and a p-aminophenyl ketone. The system may also contain a non-polymerizable plasticizer in which case improved exposure and development temperature latitude results. Processes comprising exposing the layers imagewise and photopolymerizing the exposed layers.

BACKGROUND OF THE INVENTION

Field of the invention

The invention pertains to photopolymerizable elements, compositions and processes of photopolymerization which contain novel initiating systems for free radical addition polymerization. More particularly, it pertains to such elements, compositions and processes that have polymerization initiating systems capable of increasing the speed of polymerization, improving storage and aging stability, improving the spectral response and reducing image growth of said elements and compositions. The invention also pertains to photopolymerizable elements, compositions and processes containing non-polymerizable plasticizers for improving exposure and development temperature latitude and to photomechanical printing plates comprising layers of the above photopolymerizable compositions.

Description of the prior art

Photopolymerizable compositions and elements as image-forming systems are well known in the art. Such elements may be used for preparing relief printing plates as described in detail in Plambeck, U.S.P. 2,760,863; 2,791,504; and 2,964,401, or for producing copies of images as described in U.S.P. Burg et al., 3,060,023; 3,060,024; and 3,060,025; Heiart, 3,060,026 and Colgrove, 3,353,955 or for producing lithographic printing plates as described in assignee's Alles application S.N. 560,889 filed June 27, 1966 (abandoned, but first refiled Dec. 15, 1967 as S.N. 690,732, now U.S. Pat. 3,485,311), and Chambers application S.N. 688,703 filed Dec. 7, 1967, now U.S. Pat. 3,479,185. In the uses described in the above patents and applications, the photopolymerizable elements are generally exposed imagewise to actinic radiation while in contact with an original, a process transparency, or a stencil until substantial addition polymerization takes place in the exposed areas to form an addition polymer and without substantial polymerization in the underexposed, complementary, adjoining image areas. The exposure is usually accomplished by contact transmission or reflectographic techniques. After exposure, the elements are developed by suitable means, e.g., solvent washout, thermal transfer, pressure transfer, dusting of pigments, differential adhesion of exposed vs. underexposed areas, etc. to produce e.g., an image on a receptor or a relief suitable for printing.

In the photopolymerization of the ethylenically unsaturated compounds disclosed in the above patents and applications, many initiators for increasing the speed of such polymerization are shown. Some of these initiators are the vicinal polyketaldonyl compounds of U.S. 2,367,-660, e.g., diacetyl, benzil, etc., the α-carbonyl alcohols of U.S. 2,367,661 and U.S. 2,367,670, such as benzoin, pivaloin, etc.; acyloin ethers of U.S. 2,448,828, such as benzoin methyl or ethyl ethers, etc., the α-hydrocarbon substituted aromatic acyloins of U.S. 2,722,512, e.g., α-methyl-, and α-allyl-, α-phenyl-benzoin, etc., the polynuclear quinones of Barney et al., 3,046,127 and Notley 2,951,758, and the combination of free radical producing agent and 2,4,5-triphenylimidazolyl dimer in the above Chambers application.

The initiating system described in the Chambers application is particularly useful in the preparation of lithographic printing plates. It gives high speed and the photosensitivity is inhibited less by the presence of oxygen. The spectral response can be extended into the near ultraviolet and short wavelength visible (less than 450 mμ) region of the spectrum desired for exposing lithographic plates by use of energy transfer dyes or ultraviolet absorbers. Also, by choosing an amine-substituted leuco dye as a free radical producing agent, a color is produced in the exposed areas in addition to any layer colorant. This is particularly useful when one needs to make multiple exposures in precise registration on the same plate as is commonly done in lithographic platemaking.

Such additional ingredients, while beneficial in producing highly useful printing plate, have several disadvantages. For example, while using 7-diethylamino-4-methylcoumarin described in the Chambers application is advantageous in that it not only serves as a free radical producing agent but also as an energy transfer agent by extending the spectral response into the near ultraviolet and short range visible wavelengths, compositions employing it are still not light-sensitive enough to satisfy all applications. Some extra photospeed can be obtained by using an additional free radical producing agent, such as one of the leuco dyes described in the Chambers application with the added benefit of a colored latent image. As stated in that application, it is preferred to have these materials present in the form of a salt of a strong acid, such as p-toluenesulfonic acid for maximum color formation. However, addition of strong acid to the composition to get stronger color reduces photospeed. Even more effective free radical producing agents, such as 2-mercaptobenzothiazole, must then be added to increase photosensitivity. But we have found such materials give poor aging stability and interfere with the oxidation of the leuco dye. Obviously it is desirable to eliminate as many ingredients as possible from the final composition.

SUMMARY OF THE INVENTION

The photopolymerizable compositions, layers and elements of the invention comprise (1) at least one ethylenically unsaturated monomer, (2) at least one 2,4,5-triarylimidazolyl dimer consisting of two lophine radicals bound together by a single covalent bond, at least one p-aminophenyl ketone and optionally a non-polymerizable plasticizer.

DESCRIPTION OF THE PREFERRED EMBODIMENTS

This invention, in one important aspect, comprises a photopolymerizable layer or composition containing (1) at least one non-gaseous ethylenically unsaturated compound capable of forming a high polymer by free-radical initiated, chain-propagating, addition polymerization,
(2) at least one 2,4,5-triarylimidazolyl dimer consisting of two lophine radicals bound together by a single covalent bond,
(3) at least one p-aminophenyl ketone, and optionally,
(4) a non-polymerizable plasticizer.

The ethylenically unsaturated compounds are preferably monomeric, have a boiling point above 100° C. at normal atmospheric pressure, and contain at least one terminal ethylenic group, but may contain 2–5 terminal ethylenic groups.

Upon irradiation of the layer with actinic radiation, the dimer (2) is dissociated into free radicals, these free radicals being reactive with the p-aminophenyl ketone (3) to produce active initiating radicals which react with the monomer (1) to initiate growth of polymer chains. Absorption of energy by the p-aminophenyl ketone induces dissociation of the dimer and the subsequent steps leading to polymerization the same as direct irradiation of the dimer.

The dimer (2) can be represented in one form by the formula given below, the covalent bond being attached in the 1,1′-, 1,2′-, 1,4′-, 2,2′-, 2,4′-, or 4,4′-positions, the 1,2′- compounds being preferred. The positions of the double bonds in the imidazole rings can be determined by the position of the linkage between the rings.

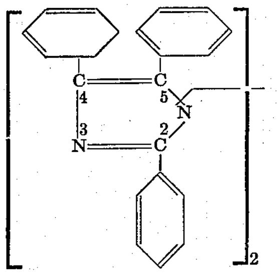

where the phenyl groups may be substituted.

While the lophine dimers seem to induce polymerization in the above polymerizable system without the presence of a p-aminophenyl ketone or other separate agent to produce initiating free radicals, it is believed that this is due to impurities present in the photopolymerizable composition which even in trace amounts function as coinitiators, as the radicals produced by irradiating the pure dimers generally do not induce significant polymerization. The 2,4,5-triphenylimidazolyl dimers having an ortho substituent on the 2-phenyl ring were found to be especially useful as components of the initiating system because of their stability. Such a dimer is 2-(o-chlorophenyl)-4,5-diphenylimidazolyl dimer, 2-(o-fluorophenyl)-4,5-diphenylimidazolyl dimer, or 2-(o-chlorophenyl)-4,5-bis-(m-methoxyphenyl) imidazolyl dimer or 2-(o-methoxyphenyl)-4,5-diphenylimidazolyl dimer.

Other dimers, either substituted or unsubstituted were also found useful. Examples of other dimers are 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2 - (p-methyl mercapto phenyl)-4,5-diphenylimidazolyl dimer, hexaphenyl lophine dimers or bis(2,3,5-triphenylimidazolyl)dimers. Suitable lophine dimers are disclosed in British patent specifications 997,396 pub. July 7, 1965 and 1,047,569 pub. Nov. 9, 1966.

The p-aminophenyl ketones are known to be sensitive to light and to act as initiators for photopolymerization reactions by themselves. However, used alone, the photospeed is much lower than when used in combination with lophine dimer, just as lophine dimer alone gives a relatively insensitive layer. The combination of dimer and p-aminophenyl ketone gives a synergistic response, the resultant performance being greater than a simple additive function.

The p-aminophenyl ketone may be represented by the formula:

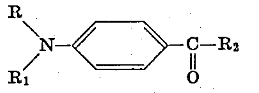

where the R and $R_1$ are each hydrogen or a lower alkyl group of from 1–4 carbon atoms and $R_2$ is alkyl, e.g., of 1–4 carbon atoms, monocarbocyclic aryl, preferably phenyl and preferably a

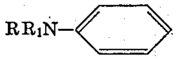

group. Suitable p-aminophenyl ketones are disclosed in assignee's Fishman application S.N. 654,677 filed July 20, 1967, and alkyl may be methyl, ethyl, propyl, and n-butyl.

A wide range of non-polymerizable plasticizers are effective in achieving improved exposure and development temperature latitude. When a macromolecular binder is present in the layer, plasticizer selection would be based on those well known in the art to be compatible with it as well as the monomer, dimer, ketone and other components. With acrylic binders, for example, dibutyl phthalate and other esters of aromatic acids; esters of aliphatic polyacids such as diisooctyl adipate, nitrate esters, etc.; aromatic or aliphatic acid esters of glycols, polyoxyalkylene glycols, aliphatic polyols, etc.; alkyl and aryl phosphates; low molecular weight polyesters or poly-α-methylstyrenes; chlorinated paraffins; and sulfonamide types may be used. In general, water insoluble plasticizers are preferred for greater high humidity storage stability, but are not necessary to get improved latitude.

In addition, the photopolymerizable compositions and layers, especially when used in the preparation of lithographic printing plates, may and preferably do contain a colorant and/or a color producing agent, e.g., a leuco dye. The amine-substituted leuco dyes can function both in the role of a color forming agent and a free radical producing agent. Especially useful leuco dyes are those having at least one dialkylamino group. Also, any amine-substituted leuco triphenylmethane dye or various salts of the dye, e.g., the HCl salt of the leuco blue dye can be used. Illustrations of suitable dyes include tris-(4-N,N-diethylamino-o-tolyl)-methane trihydrochloride, bis(4-N,N-diethylamino-o-tolyl) thienylmethane, bis(4-N,N-diethylamino-o-tolyl) methylenedioxyphenylmethane, leuco neutral shade dye, i.e., bis(4-N,N-diethylamino-o-tolyl)-benzyl thiophenylmethane, Leuco Malachite Green (C.I. Basic Green 4), leuco forms of Crystal Violet, Brilliant Green (C.I. Basic Green 1), Victoria Green 3B (C.I. Basic Green 4), Acid Green GG (C.I. Acid Green 3), Methyl Violet (C.I. Basic Violet 1), Rosaniline (C.I. Basic Violet 14), etc. The salt form, e.g., HCl salts, salts with Lewis acids, sulfuric acid salts, p-toluene sulfonic acid salts, etc. of the leuco dye can be used but the free base is preferred. Other free radical producing agents which may be used with those above are the organic amines disclosed in the Chambers application.

The useful concentration of dimer and ketone is not at all critical and is limited only by the solubilities of the initiating components in the monomer-binder coating composition. When a leuco dye is used as the free radical producing agent, a ratio of leuco dye to the dimer of 1:2 gives best results as to photospeed and aging behavior.

In another aspect, the invention involves a process of making images in a polymerizable layer which comprises exposing to actinic light selected portions of the photopolymerizable layer containing the three or four-component system until substantial addition polymerization occurs in the exposed areas of said layer with substantially no polymerization in the unexposed portions of the layer and optionally removing said latter portions with a development operation. The development may be accomplished by solvent washout, thermal transfer, pressure transfer, application of pigments to unpolymerized areas, differential adhesion of the exposed vs. unexposed areas, etc. The development will produce either a relief or an image on a separate receptor. Schlieren optics or other physical means can also be used to distinguish between polymerized and unpolymerized image areas.

The coating composition containing the novel dimer-ketone initiating system of the invention comprises a thermoplastic binder, e.g., cellulose acetate, cellulose acetate butyrate, polymethyl acrylate, polymethyl methacrylate, methyl methacrylate copolymerized with methacrylic acid, etc. Other suitable binders are shown in assignee's Colgrove U.S.P. 3,353,955 patented Nov. 21, 1967. To the binder in a suitable solvent is added a monomer which is ethylenically unsaturated and suitable for free radical initiated, chain-propagating addition polymerization, e.g., pentaerythritol triacrylate, polyethylene glycol diacrylate, triethylene glycol diacrylate, polyethylene glycol dimethacrylate, polymethylene diacrylate and dimethacrylate, trimethylolpropane triacrylate and trimethacrylate.

The addition polymerizable polymers disclosed in assignee's Schoenthaler, U.S. Ser. No. 451,300 filed Apr. 27, 1965, now U.S. Patent 3,418,295, and Celeste, U.S. Ser. No. 533,817 filed Mar. 14, 1966, now U.S. Patent 3,448,089, can be used in lieu of or. in combination with the monomer-binder systems. When the monomer-binder is in solution in a suitable solvent, i.e., acetone, ethanol, methanol, ethyl Cellosolve, etc., the 2,4,5-triphenylimidazolyl dimer and the 4,4′-dialkylaminobenzophenone and plasticizer are added while in liquid form, e.g., the dimer ketone and plasticizer are in acetone, methanol or ethyl Cellosolve. The solution is stirred or mixed and coated on a support by prior art coating methods and allowed to dry. The compositions can be thoroughly mixed by the aid of any conventional mixing apparatus. If desired, a cover sheet, such as described in assignee's Heiart, U.S.P. 3,060,026, Oct. 23, 1962, can be laminated to the photopolymerizable layer, or the layer can be overcoated with a wax layer such as described in assignee's Burg, U.S.P. 3,203,805, Aug. 31, 1965, or a layer of polyvinyl alcohol or gelatin can be coated as described in assignee's Alles application, U.S. Ser. No. 560,889 filed June 27, 1966. The photopolymerizable layer may contain the pigments or dyes described in assignee's Burg et al., U.S.P. 3,060,023.

The invention will now be further illustrated but is not intended to be limited by the following examples.

*Example I.*—This example will demonstrate the synergistic effect of the combination of lophine dimer and the p-amino-phenone, Michler's ketone. Three compositions were prepared as follows:

| | Grams |
|---|---|
| Poly(methyl methacrylate/methacrylic acid (90/10) | 300.0 |
| Trimethylolpropane triacrylate | 150.0 |
| 2-(o-chlorophenyl) 4,5-bis(m-methoxyphenyl) imidazolyl dimer | 11.2 |
| Michler's ketone, 4,4′-bis(dimethylamino) benzophenone | 6.0 |
| 2-ethoxyethanol | 1500.0 |

The composition was thoroughly mixed by mechanical stirring and coated on a grained aluminum plate and dried. A second plate was coated with the above composition but without the addition of the dimer. A third plate was coated with the above composition but without the addition of Michler's ketone. The plates were overcoated with the following composition.

Polyvinyl pyrrolidone (M.W. 30,000)—90 grams
Polyvinyl alcohol (medium viscosity 88% saponified)—60 grams
2-ethoxyethanol—45 ml.
Ethanol—45 ml.
Surfactant (isooctyl phenyl polyethoxy ethanol) 10% aqueous solution —15 ml.

The dried plates were exposed through a negative (21 $\sqrt{2}$ step Graphic Arts Technical Foundation exposure wedge) in a vacuum frame by a carbon arc (B–1C Constantarc—140 amp. No. 1112—Ld612 Macbeth Arc Lamp Company, Philadelphia, Pa.) for 26 seconds placed 56 inches from the lamp. The plates were developed by washing out the unexposed parts of the coatings using a solution of the following composition:

Trisodium phosphate ($Na_3PO_4 \cdot 12H_2O$)—25.0 grams
Sodium phosphate (monobasic $NaH_2PO_4$-$H_2O$)—4.4 grams
2-butoxyethanol—70.0 ml.
Surfactant (isooctyl phenyl polyethoxy ethanol 10% by wt. aqueous)—2.0 ml.
Water (distilled) to make 1.0 liter.
pH adjusted to 11.0.

The first plate coated with the composition containing both the dimer and Michler's ketone gave a good image of 9 $\sqrt{2}$ steps. Neither the plate using the ketone alone or the plate using the dimer alone showed an image when exposed for 26 seconds. An exposure of 162 seconds gave an image of 4 $\sqrt{2}$ steps in the case of the plate using the ketone and only 1 $\sqrt{2}$ step in the case of the plate having the dimer alone.

*Example II.*—This example will demonstrate the advantage of adding a water-insoluble polyethylene glycol type of plasticizer. A coating composition was made of the following compounds:

| | Grams |
|---|---|
| Poly(methyl methacrylate/methacrylic acid) (90/10) | 300.0 |
| Trimethylolpropane triacrylate | 114.0 |
| 2-(o-chlorophenyl) 4,5-bis(m-methoxyphenyl) imidazolyl dimer | 11.2 |
| Tris-(p-diethylamino-o-tolyl)methane | 9.0 |
| 4,4′-bisdimethylaminobenzophenone | 6.0 |
| C.I. Solvent Red #109 | 6.0 |
| Mixture of hexanoic and octanoic acid ester of triethylene glycol | 36.0 |
| 2-ethoxyethanol to bring total weight to | 1500.0 |

The above composition was thoroughly mixed by mechanical stirring and coated on a grained aluminum plate. A similar coating was made using 150.0 grams of the tri-acrylate monomer and no glycol plasticizer. The plates were overcoated as described in Example I. The plates were similar in speed but the plate with the plasticizer gave higher contrast.

The plates were tested to determine the latitude of temperature during exposure. The plates were exposed for 33 seconds as described in Example I at the temperature shown and developed in the developer described in Example I to give the results shown in the table.

| | $\sqrt{2}$ steps | |
|---|---|---|
| Exposing temperature | Plate containing glycol plasticizer | Plate not containing glycol plasticizer |
| 27° C. | 9 | 8 |
| 34° C. | 9 | 9 |
| 37° C. | 10 | 10 |

The above results show that the presence of the glycol compound decreases the sensitivity of the layer to temperature changes during exposure. The layer without the glycol compound showed that the photographic speed doubled while the temperature changed from 27° C. to 37° C.

The plates were also tested for the effect in temperature change of the developing solution. The plates were exposed 33 seconds (Macbeth carbon arc 140-amp.) and developed in the developer described in Example I to give the results shown in the following table.

| | $\sqrt{2}$ steps | |
|---|---|---|
| Development temperature | Plate containing glycol plasticizer | Plate not containing glycol plasticizer |
| 29.4° C | 8 | 6 |
| 24.2° C | 9 | 8 |
| 17.8° C | 10 | (1) |

1 Unexposed areas can not be removed completely.

The plate containing the plasticizer is much less sensitive to developer temperature change than the plate without this adjuvant. The plates were also tested for aging stability by exposing for 26 seconds at a distance of 56 inches from the arc lamp after conditioning the plates as indicated in the following table. The results are shown in the table. The developer used was that described in Example I.

| | $\sqrt{2}$ steps | | |
|---|---|---|---|
| | Fresh | Dry oven, 1 wk., 50° C. | Tropical oven,, 80% RH. 37.8° C. |
| Plate containing glycol plasticizer | 9 | 9 | 8 |
| Plate not containing glycol plasticizer | 9 | 9 | 6 |

A representative plate was exposed through a halftone lithographic negative for 26 sec. at a distance of 56 inches from the carbon lamp. A visible purple image appeared by virtue of the leuco dye which during exposure oxidized to a blue dye. The plate was developed in the developer of Example I yielding a good visible red image in the exposed areas which readily accepted greasy ink. The unexposed areas were clear and readily wetted with water. An analysis of the halftone dots showed the presence of good quality 2% dots in the highlight areas and 98% dots in the shadow areas. The plate was treated with an aqueous gum solution in a conventional manner and placed on a wet offset printing press using a printing ink and a fountain solution. About 250,000 impressions were made with no visible signs of wear at the end of the run. No special attention was given the plate during the run.

*Example III.*—A coating composition was made as follows:

| | Grams |
|---|---|
| Poly(methyl methacrylate/methacrylic acid) (90/10) | 300.0 |
| Trimethylolpropane triacrylate | 114.0 |
| 2-(o-chlorophenyl)4,5 - bis(m - methoxyphenyl) imidazolyl dimer | 11.2 |
| Michler's ketone | 6.0 |
| Tris-(p-diethylamino-o-tolyl)methane | 9.0 |
| Mixture of hexanoic and octanoic acid esters of triethylene glycol | 36.0 |
| 2-ethoxyethanol to make | 1500.0 |

The composition was thoroughly mixed by mechanical stirring and coated on a grained aluminum plate and dried and then overcoated as described in Example I.

The plate was exposed as described in Example I and a visible image appeared in the exposed areas without development. This facilitates the making of multiple exposures on a single plate before development. Upon development as described in Example I, an image of $9\sqrt{2}$ steps was obtained showing that the leuco dye was not detrimental to speed.

*Example IV.*—This example shows the wide range of quantities of 4,4'-dialkylaminobenzophenone which may be used in the system.

Three coating compositions were made using the formula of Example I, one portion (A) contained 1.75 grams of Michler's ketone, a second portion (B) contained 3.0 grams of Michler's ketone and a third portion (C) contained 6.0 grams of the ketone. The compositions were coated, dried and overcoated with the overcoating composition shown in Example I. The elements were exposed for 65 seconds in a Nu Arc "Flip-Top" Platemaker, Model FT26M-2 and developed in a solution like that of Example I. All three plates showed images of $8\sqrt{2}$ steps.

*Example V.*—A coating composition was formulated as follows:

| | Grams |
|---|---|
| Poly(methyl methacrylate/methacrylic acid) (90/10) | 300.0 |
| Trimethylolpropane triacrylate | 114.0 |
| 2-(o-chlorophenyl)-4,5-dimethoxy-phenylimidazolyl dimer | 11.2 |
| Michler's ketone | 6.0 |
| Triethylene glycol diacetate | 70.0 |
| Tris-(p-diethylamino-o-tolyl)methane | 9.0 |
| C.I. Solvent Red #109 | 6.0 |
| 2-ethoxyethanol to a total weight of | 1500.0 |

The composition was mixed by mechanical stirring and coated on a grained aluminum plate and then overcoated as described in Example I. The plate was exposed and developed as described in Example I to give a good image of $10\sqrt{2}$ steps.

*Example VI.*—A coating composition was formulated as follows:

| | Grams |
|---|---|
| Poly(methyl methacrylate/methacrylic acid) (90/10) | 300.0 |
| Trimethylolpropane triacrylate | 114.0 |
| 2-(o-chlorophenyl)4,5-bis(m-methoxyphenyl) imidazolyl dimer | 11.2 |
| Michler's ketone | 6.0 |
| Triethylene glycol dibenzoate | 54.0 |
| Tris-(p-diethylamino-o-tolyl)methane | 9.0 |
| C.I. Solvent Red #109 | 6.0 |
| 2-ethoxyethanol to make | 1500.0 |

The composition was thoroughly mixed by stirring and coated on a grained aluminum plate and overcoated as described in Example I. The plate was exposed and developed as described above and an image of $7\sqrt{2}$ steps was obtained.

*Example VII.*—Example VI was repeated only using 64.5 grams of tricresyl phosphate as a plasticizer in place of the triethylene glycol dibenzoate of that example. The processed plate gave an image of $7\sqrt{2}$ steps.

*Example VIII.*—Example VI was repeated using 36.0 grams of dibutyl phthalate in place of the triethylene glycol dibenzoate of that example. The processed plate gave an image of $6\sqrt{2}$ steps.

*Example IX.*—A composition was formulated as follows:

| | Grams |
|---|---|
| Poly(methyl methacrylate/methacrylic acid) (90/10) | 300.0 |
| Trimethylolpropane triacrylate | 150.0 |
| 2-(o-chlorophenyl)4,5 - bis(m - methoxyphenyl) imidazolyl dimer | 11.2 |
| p-(N,N-dimethylamino)acetophenone | 6.0 |
| Methyl ethyl ketone to make | 1500.0 |

A plate coated with the above preparation showed an image of $6\sqrt{2}$ steps.

*Example X.*—A composition was formulated as follows:

| | Grams |
|---|---|
| Poly(methyl methacrylate/methacrylic acid) (90/10) | 300.0 |
| Trimethylolpropane triacrylate | 150.0 |
| 2-(o-chlorophenyl)4,5 - bis(m - methoxyphenyl) imidazolyl dimer | 11.2 |
| 4,4'-bis(diethylamino)benzophenone | 6.0 |
| Methyl ethyl ketone to make | 1500.0 |

A plate coated with the above composition and treated as described above gave an image of $9\sqrt{2}$ steps.

*Example XI.*—A composition was formulated as follows:

| | Grams |
|---|---|
| Poly(methyl methacrylate/methacrylic acid) (90/10) | 300.0 |
| Trimethylolpropane triacrylate | 150.0 |
| 2-(o-chlorophenyl)4,5 - bis(m - methoxyphenyl) imidazolyl dimer | 11.2 |
| Michler's ketone | 6.0 |
| Methyl ethyl ketone to make | 1500.0 |

A plate coated with the above composition and treated as Example I gave an image of $10\sqrt{2}$ steps.

*Example XII.*—A composition was formulated as follows:

| | Grams |
|---|---|
| Cellulose acetate butyrate | 300.0 |
| Trimethylolpropane triacrylate | 150.0 |
| 2-(o-chlorophenyl)4,5 - bis(m - methoxyphenyl) imidazolyl dimer | 11.2 |
| Michler's ketone | 6.0 |
| Methyl ethyl ketone to make | 1500.0 |

A plate coated with the above composition and further treated as described in Example I gave an image of $8\sqrt{2}$ steps when developed in a solution of 9/1 ethyl Cellosolve and water.

*Example XIII.*—A composition was formulated as follows:

| | Grams |
|---|---|
| Poly(methyl methacrylate/methacrylic acid) (90/10) | 300.0 |
| Tetraethylene glycol dimethacrylate | 150.0 |
| 2 - (o-chlorophenyl)4,5 - bis(m-methoxyphenyl) imidazolyl dimer | 11.2 |
| Michler's ketone | 6.0 |
| Methyl ethyl ketone to make | 1500.0 |

A plate coated with the above composition and treated as above gave an image of $17\sqrt{2}$ steps.

*Example XIV.*—A composition was formulated as follows:

| | Grams |
|---|---|
| Poly(methyl methacrylate/methacrylic acid) (90/10) | 300.0 |
| Trimethylolpropane triacrylate | 114.0 |
| 2 - (o-chlorophenyl)4,5 - bis(m-methoxyphenyl) imidazolyl dimer | 36.0 |
| Michler's ketone | 6.0 |
| Mixture of hexanoic and octanoic acid esters of triethylene glycol | 36.0 |
| Leuco malachite green | 9.0 |
| 2-ethoxyethanol to make | 1500.0 |

The above composition was coated on a grained aluminum plate and overcoated and further treated as described in Example I. Upon exposure and without development the exposed areas gave a visible green image of $10\sqrt{2}$ steps.

*Example XV.*—A composition was formulated as follows:

| | Grams |
|---|---|
| Poly(methyl methacrylate/methacrylic acid) (90/10) | 300.0 |
| Trimethylolpropane triacrylate | 150.0 |
| Michler's ketone | 6.0 |
| 2 - (o-chlorophenyl)4,5 - bis(m-methoxyphenyl) imidazolyl dimer | 11.2 |
| N,N-diethylaniline | 6.0 |
| 2-ethoxyethanol to make | 1500.0 |

The plate coated with the above composition and further treated as in Example I gave a good quality image of $8\sqrt{2}$ steps.

*Example XVI.*—A composition was formulated as follows:

| | Grams |
|---|---|
| Poly(methyl methacrylate/methacrylic acid) (90/10) | 300.0 |
| Trimethylolpropane triacrylate | 150.0 |
| 2 - (o-chlorophenyl)4,5 - bis(m-methoxyphenyl) imidazolyl dimer | 11.2 |
| Bis(4,4 - diethylamino)benzophenone | 6.0 |
| N-phenylglycine | 6.0 |
| Methyl ethyl ketone to make | 1500.0 |

A plate made using the above composition gave an image having $15\sqrt{2}$ steps.

*Example XVII.*—A thermal transfer element of the type described in assignee's Burg, U.S. Patent 3,060,024 was made by coating a polyethylene terephthalate film support with the following composition:

| | Grams |
|---|---|
| Cellulose acetate butyrate | 20.0 |
| Trimethylolpropane trimethacrylate | 28.0 |
| 20 - (o-chlorophenyl)4,5 - bis(m - methoxyphenyl) imidazolyl dimer | .748 |
| Michler's ketone | .40 |
| Methyl ethyl ketone to make | 360.0 |

After coating and drying the layer, there was laminated to the surface of the coated layer a sheet of film of the same type as the support.

The element was exposed for 26 seconds on the Macbeth arc lamp described above, using the $21\sqrt{2}$ step wedge as a light-modulating means. The laminated film was then stripped off and the pigment, molybdate orange, was dusted on the surface of the layer. The unpolymerized areas retained the pigment while the polymerized areas did not accept the pigment. Six $\sqrt{2}$ steps showed as a pigmented image which could be thermally transferred to a paper support to give a glossy, pigment-free surface image of good quality.

*Example XVIII.*—An element for use as a photoresist was made by coating on the film support of Example XVII the following composition:

| | Grams |
|---|---|
| Polymethyl methacrylate | 57.1 |
| Trimethylolpropane triacrylate | 33.1 |
| 2 - (o-chlorophenyl)4,5 - bis(m-methoxyphenyl) imidazolyl dimer | 2.24 |
| Tris-(p-diethylamino-o-tolyl) methane | 1.76 |
| Michler's ketone | 1.20 |
| Trichloroethylene to make | 950.0 |

After drying the coating, the surface was laminated at a temperature of 115° C. to a clean, copper-clad, epoxy-fiber glassboard in the manner described in assignee's Celeste application, U.S. Ser. No. 477,016, filed Aug. 3, 1965, now abandoned.

The element was exposed through the film through the step wedge described above 26 seconds on the Macbeth arc lamp. The film was stripped off and the exposed layer was developed by soaking in 1,1,1-trichloroethane for 40 seconds and then wiped dry. A five $\sqrt{2}$ step image remained on the board. Such an element could be used to make a printed circuit.

While the above examples demonstrate the applicability of the invention to the preparation of high quality lithographic printing plates, the polymerizable materials incorporating the novel initiating systems have many applications. For example, they can be used in the fabrication of photopolymerizable compositions for the production of relief printing plates as disclosed in Plambeck, U.S.P. 2,760,863.

The compositions of the present invention may also be useful for a variety of copying, i.e., office copying, recording, decorative and manufacturing applications. Pigments, e.g., $TiO_2$, colloidal carbon, metal powders, phosphors, etc., and dyes which do not appreciably absorb light at the wavelength being used for exposure or inhibit polymerization can be incorporated in the light sensitive photopolymerizable layers, and by dry thermal transfer development, images can be transferred to a receptor support. Multicopies of the process images can be obtained and transferred to receptor supports. The invention can be used in the preparation of multicolor reproductions.

An advantage of the polymerizable compositions of this invention is that photosensitive layers comprising such compositions have enhanced photographic speed and contrast. They have good exposure temperature and development latitude. Photosensitive elements comprising the photopolymerizable compositions of this invention have exceptionally good aging stability and long shelf life.

The embodiments of the invention in which an exclusive property or privilege is claimed are defined as follows:

1. A photopolymerizable composition containing (1) at least one non-gaseous ethylenically unsaturated compound capable of forming a high polymer by free-radical initiated, chain-propagating, addition polymerization, (2) at least one 2,4,5-triarylimidazolyl dimer consisting of two lophine radicals bound together by a single covalent bond, and (3) at least one p-aminophenyl ketone.

2. A composition according to claim 1 containing (4) a non-polymerizable organic plasticizing agent.

3. A composition according to claim 1, wherein the p-aminophenyl ketone has the formula

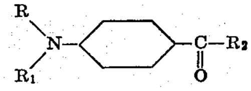

where R and $R_1$ are each H or an alkyl radical of 1–4 carbon atoms, and $R_2$ is alkyl or monocarbocyclic aryl.

4. A composition according to claim 1, wherein the unsaturated compound contains 1–5 terminal ethylenic groups.

5. A photopolymerizable element comprising a support bearing a layer containing (1) at least one non-gaseous ethylenically unsaturated compound capable of forming a high polymer by free-radical initiated, chain-propagating, addition polymerization, (2) at least one 2,4,5-triphenylimidazolyl dimer consisting of two lophine radicals bound together by a single covalent bond, and (3) at least one p-aminophenyl ketone.

6. A photopolymerizable element according to claim 5 containing (4) a non-polymerizable organic plasticizing agent.

7. A photopolymerizable element according to claim 5, wherein the p-aminophenyl ketone has the formula

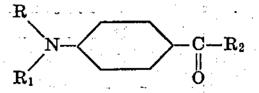

where R and $R_1$ are each H or an alkyl radical of 1–4 carbon atoms, and $R_2$ is alkyl or monocarbocyclic aryl.

8. A photopolymerizable element according to claim 5, wherein the unsaturated compound contains 1–5 terminal ethylenic groups.

9. A photopolymerizable element according to claim 5, wherein said ketone is tetramethyl-p,p'-diaminobenzophenone.

10. A photopolymerizable element according to claim 5 on a metal support.

11. A photopolymerizable element according to claim 5 on an aluminum support.

12. A photopolymerizable element according to claim 5 containing a colorant.

13. A photopolymerizable element according to claim 5 containing a colorant and a leuco dye.

14. A process which comprises exposing, imagewise, to actinic radiation a photopolymerizable element according to claim 5.

References Cited

UNITED STATES PATENTS 3,479,185 11/1969 Chambers ---------- 96—115X
3,462,268 8/1969 Danhauser et al. ----- 96—35.1

RONALD H. SMITH, Primary Examiner

U.S. Cl. X.R.

96—115; 204—159.23